United States Patent
Zweigle et al.

(10) Patent No.: US 10,729,023 B2
(45) Date of Patent: Jul. 28, 2020

(54) METHOD FOR PRODUCING AN ELECTRONIC ASSEMBLY, AND ELECTRONIC ASSEMBLY, IN PARTICULAR FOR A TRANSMISSION CONTROL MODULE

(71) Applicant: Robert Bosch GmbH, Stuttgart (DE)

(72) Inventors: Peter Zweigle, Ditzingen (DE); Helmut Deringer, Erligheim (DE); Jens Hoffmann, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/337,299

(22) PCT Filed: Sep. 1, 2017

(86) PCT No.: PCT/EP2017/072020
§ 371 (c)(1),
(2) Date: Mar. 27, 2019

(87) PCT Pub. No.: WO2018/059873
PCT Pub. Date: Apr. 5, 2018

(65) Prior Publication Data
US 2019/0230804 A1    Jul. 25, 2019

(30) Foreign Application Priority Data
Sep. 30, 2016   (DE) ................. 10 2016 219 116

(51) Int. Cl.
*H05K 5/00*     (2006.01)
*H05K 3/28*     (2006.01)
(Continued)

(52) U.S. Cl.
CPC ......... *H05K 5/0082* (2013.01); *H05K 1/0203* (2013.01); *H05K 1/181* (2013.01);
(Continued)

(58) Field of Classification Search
CPC ...................................................... H05K 5/00
See application file for complete search history.

(56) References Cited

U.S. PATENT DOCUMENTS

| 6,143,588 A | 11/2000 | Glenn |
| 2003/0209590 A1* | 11/2003 | Fortin ............. H05K 3/305 228/180.22 |
| 2004/0056349 A1* | 3/2004 | Yamada ............ H01L 23/049 257/724 |

FOREIGN PATENT DOCUMENTS

| DE | 44 05 710 A1 | 8/1995 |
| DE | 10 2014 217 351 A1 | 3/2016 |
| EP | 2 273 859 A2 | 1/2011 |

OTHER PUBLICATIONS

International Search Report corresponding to PCT Application No. PCT/EP2017/072020, dated Dec. 7, 2017 (German and English language document) (5 pages).

* cited by examiner

*Primary Examiner* — Jerry Wu
(74) *Attorney, Agent, or Firm* — Maginot, Moore & Beck LLP

(57) ABSTRACT

A method for producing an electronic assembly includes providing a printed circuit board with a first face, a second face facing away from the first face, and a first component arranged on the first face. The method further includes arranging the circuit board such that the second face lies on a reference surface, and applying a sealing material which is substantially not flowable prior to being cured onto the first face. The sealing material surrounds a sub-region of the first face of the circuit board. The method further includes arranging a second component at least partly on the reference surface such that the second component is pressed into the sealing material, electrically connecting the second component to the circuit board via an electric connection line, (Continued)

and applying a covering material onto the circuit board first face sub-region surrounded by the sealing material and onto the first component.

14 Claims, 2 Drawing Sheets

(51) Int. Cl.
*H05K 1/02* (2006.01)
*H05K 1/18* (2006.01)
*H05K 5/06* (2006.01)

(52) U.S. Cl.
CPC ............. *H05K 3/284* (2013.01); *H05K 5/065* (2013.01); *H05K 2201/066* (2013.01); *H05K 2201/09909* (2013.01); *H05K 2201/1031* (2013.01); *H05K 2201/10151* (2013.01); *H05K 2203/1316* (2013.01); *H05K 2203/1327* (2013.01); *H05K 2203/167* (2013.01); *Y02P 70/611* (2015.11)

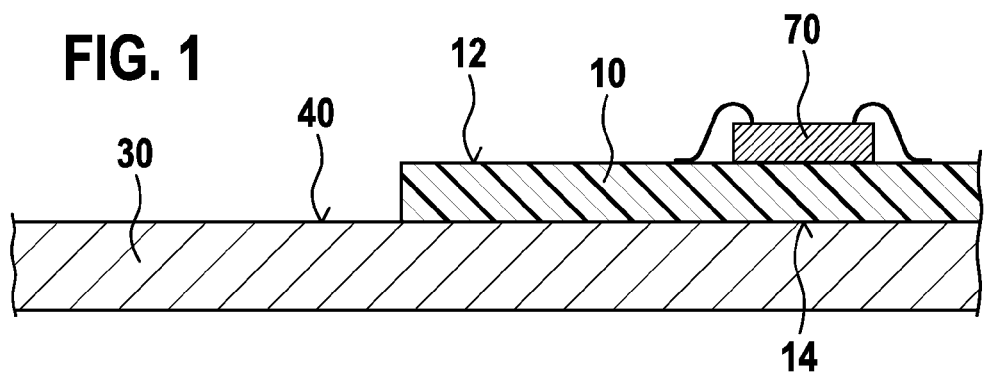
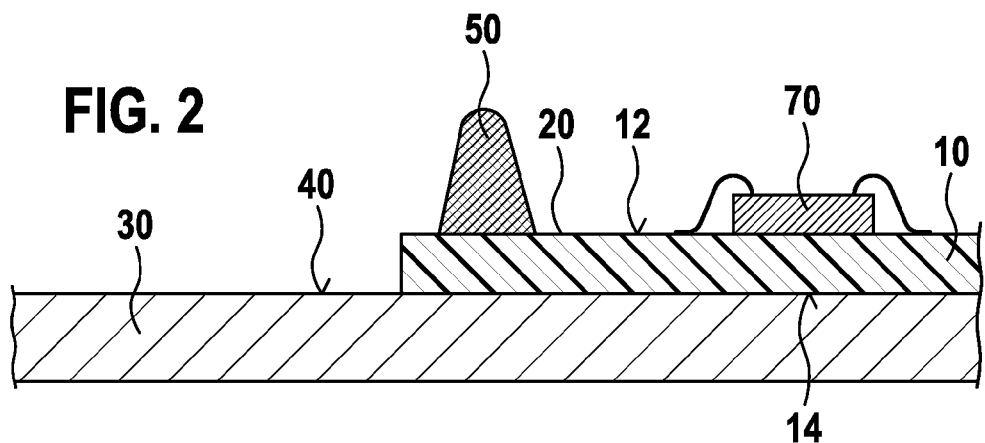
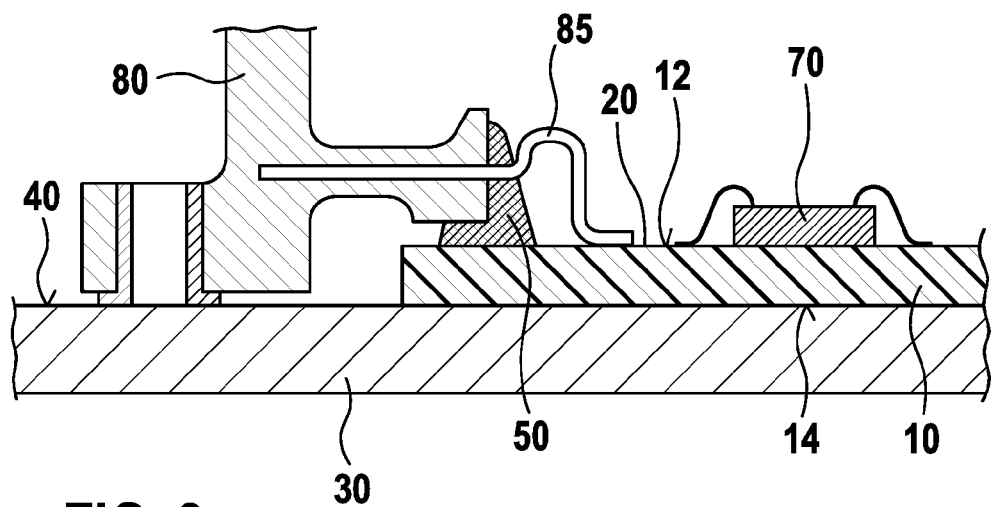

METHOD FOR PRODUCING AN ELECTRONIC ASSEMBLY, AND ELECTRONIC ASSEMBLY, IN PARTICULAR FOR A TRANSMISSION CONTROL MODULE

This application is a 35 U.S.C. § 371 National Stage Application of PCT/EP2017/072020, filed on Sep. 1, 2017, which claims the benefit of priority to Serial No. DE 10 2016 219 116.0, filed on Sep. 30, 2016 in Germany, the disclosures of which are incorporated herein by reference in their entirety.

The disclosure relates to a method for producing an electronic assembly and to an electronic assembly, in particular for a transmission control module.

BACKGROUND

Many electronic assemblies are known. If it is for example part of a transmission control module, the electronic assembly must be sealed in an oil-proof manner, since the transmission control module is surrounded by oil. The electronic assembly usually comprises a printed circuit board with electronic components arranged on it.

Large individual components, such as for example sensors, are to some extent not arranged on the printed circuit board and are electrically connected to the printed circuit board. Since the oil often contains conductive particles, an electrical insulation of the components and of the electrical connection between the large individual component that is not arranged (completely) on the printed circuit board and the printed circuit board is necessary. Generally used for this are covers or swarf protection covers, which are clipped on, riveted or held down on the printed circuit board by other methods, in order to establish an oil-tight and/or swarf-tight seal.

A disadvantage of this is that the transmission control module with the electronic assembly or the electronic assembly is less stable and robust and involves high production costs and great production effort. Moreover, generally mechanical stresses may occur between the large individual component and the printed circuit board, as a result of which the service life or seal-tightness of the transmission control module or the electronic assembly is reduced. Furthermore, as a result of the tolerance in the thickness of the printed circuit board, the electronic assembly can generally only be placed very inaccurately in terms of height, which can lead to problems, in particular in the case of sensors.

SUMMARY

Embodiments of the disclosure can advantageously make it possible to provide a method for producing an electronic assembly or to provide an electronic assembly, in particular for a transmission control module, that is oil-tight and has great robustness, low production costs and a long service life. The fact that there are substantially no mechanical stresses between the component that is not arranged completely on the printed circuit board and the printed circuit board means that there is a durable oil tightness. By obviating the need for a swarf protection cover, the production process is simplified. Furthermore, it is generally possible to place the electronic assembly on the same reference surface as the electronics themselves.

According to a first aspect of the disclosure, a method for producing an electronic assembly, in particular for a transmission control module, is proposed, comprising the following steps: providing a printed circuit board having a first side and a second side, facing away from the first side, and having at least one first electronic component arranged on the first side of the printed circuit board; arranging the printed circuit board with the second side at least partially on a reference surface; applying a sealing material that is substantially not flowable prior to being cured to the first side, the sealing material being applied in such a way that the sealing material surrounds a sub-region of the first side of the printed circuit board; arranging a second component at least partially on the reference surface in such a way that the second component is partially pressed into the sealing material; electrically connecting the second component to the printed circuit board by means of an electrical connecting line; applying a covering material, in particular a covering material that is flowable prior to being cured, to the sub-region of the first side of the printed circuit board that is surrounded by the sealing material and to the first component; curing the sealing material; and curing the covering material.

According to a second aspect of the disclosure, an electronic assembly, in particular for a transmission control module, is proposed, comprising: a printed circuit board having a first side and a second side, facing away from the first side, and having at least one first electronic component arranged on the first side of the printed circuit board, the printed circuit board being arranged with the second side on a reference surface; a sealing material that is substantially not flowable prior to being cured on the first side, the sealing material surrounding a sub-region of the first side of the printed circuit board; at least one second component, the second component being electrically connected to the printed circuit board, and a covering material, in particular a covering material that is flowable prior to being cured, the covering material being arranged on the sub-region of the first side that is surrounded by the sealing material and on the first component, characterized in that the second component is partially arranged on the reference surface in such a way that the second component is partially pressed into the sealing material for sealing an intermediate space between the second component and the first side of the printed circuit board.

Ideas relating to embodiments of the disclosure may be regarded as based inter alia on the concepts and findings described below.

In one embodiment, the reference surface is the surface of a heat sink for dissipating heat from the electronic assembly. One advantage of this is that the printed circuit board remains in good thermal contact with the reference surface. As a result, the heat can be dissipated well from the electronic assembly, in particular from the first component.

In one embodiment, the reference surface is the surface of a mounting aid, and the method also comprises the following step: removing the printed circuit board and the second component from the mounting aid. As a result, the printed circuit board and the second component can generally be aligned the same in relation to a mounting surface or the surface or the mounting aid in a technically simple way. By removing the mounting aid after the alignment, the flexibility of the installation or the installation location of the printed circuit board and the second component is increased. The mounting aid can usually be any type of device that has a level or planar surface. The mounting aid may for example be an aligning table or a mounting table.

In one embodiment, the sealing material is applied to a peripheral region of the first side of the printed circuit board. This ensures that substantially the entire first side of the printed circuit board is covered by the covering material. This ensures the electrical insulation of the printed circuit board from the surroundings.

In one embodiment, the covering material is applied to the first side of the printed circuit board in such a way that the covering material covers and/or encloses the electrical connecting line. This ensures that the electrical connecting line is likewise electrically insulated from the surroundings in a technically simple way.

In one embodiment of the method, the sealing material and the covering material have substantially the same coefficient of thermal expansion. As a result, the occurrence of mechanical stress is avoided even more reliably.

In one embodiment, the reference surface is the surface of a heat sink for dissipating heat from the electronic assembly. One advantage of this is that the printed circuit board is in good thermal contact with the reference surface. As a result, the heat can be dissipated well from the electronic assembly, in particular from the first component.

In one embodiment, the sealing material is applied to a peripheral region of the first side of the printed circuit board. This ensures that substantially the entire first side of the printed circuit board is covered by the covering material. This ensures the electrical insulation of the printed circuit board from the surroundings.

In one embodiment, the covering material covers and/or encloses the electrical connecting line. This ensures that the electrical connecting line is likewise electrically insulated from the surroundings in a technically simple way.

In one embodiment of the electrical assembly, the sealing material and the covering material have substantially the same coefficient of thermal expansion. As a result, the occurrence of mechanical stress is avoided even more reliably.

It is pointed out that some of the possible features and advantages of the disclosure are described herein with reference to different embodiments of the electronic assembly. A person skilled in the art recognizes that the features can be combined, adapted or exchanged in a suitable way to arrive at further embodiments of the disclosure.

BRIEF DESCRIPTION OF THE DRAWINGS

Embodiments of the disclosure are described below with reference to the accompanying drawings, in which connection neither the drawings nor the description should be construed as restricting the disclosure.

FIG. 1 shows a schematic view after a first step of the method according to the disclosure for producing an electronic assembly;

FIG. 2 shows a schematic view after a second step of the method according to the disclosure for producing an electronic assembly;

FIG. 3 shows a schematic view after a third step of the method according to the disclosure for producing an electronic assembly;

Figure 4:
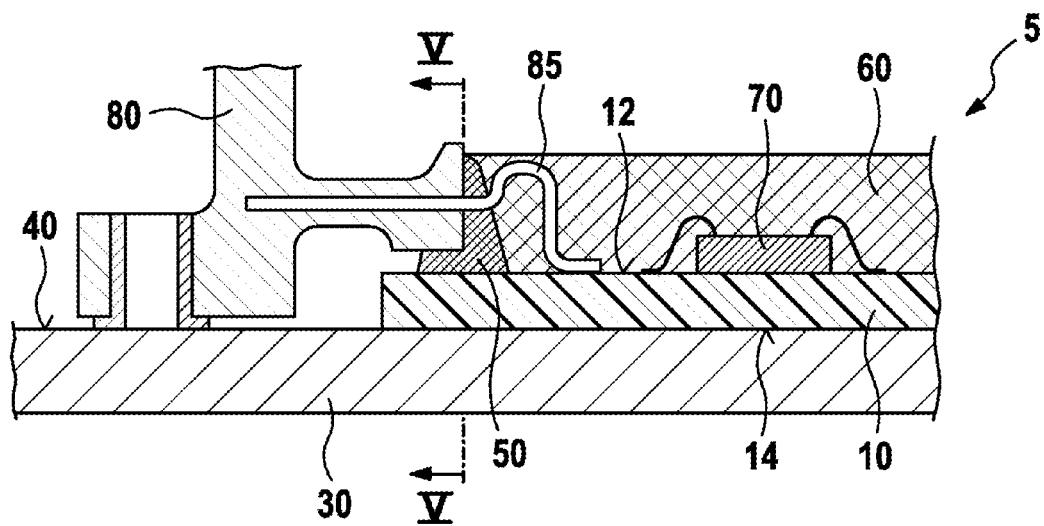
FIG. 4 shows a schematic view of an embodiment of the electronic assembly according to the disclosure.

The figures are only schematically depicted and not true to scale. In the figures, the same designations denote features that are the same or have the same effect.

DETAILED DESCRIPTION

FIG. 1 shows a schematic view after a first step of the method according to the disclosure for producing an electronic assembly 5. The electronic assembly 5 may be part of a transmission control module for a vehicle.

First, a printed circuit board 10 (PCB) is provided. The printed circuit board 10 has a first side 12 (on top in FIG. 1) and a second side 14 (underneath in FIG. 1), the second side 14 being opposite from the first side 12. Arranged on the first side 12 of the printed circuit board 10 is at least one first electronic component 70. The first electronic component 70 is electrically connected to the printed circuit board 10.

The printed circuit board 10 is arranged on a reference surface 40. The second side 14 of the printed circuit board 10 is connected over its surface area to the reference surface 40 or is fastened on it. Alternatively, it may also be only during production that the printed circuit board lies on a reference surface or mounting surface or a surface of a mounting aid. The reference surface 40 may be the surface of a housing of the transmission control module or just be present during production. The reference surface 40 is in particular the surface of a heat sink 30, which removes heat from the electronic assembly 5 or the first components 70/the printed circuit board 10. The heat sink 30 may for example be the housing of a transmission control module, part of which is the electronic assembly 5.

The printed circuit board 10 may be adhesively bonded to the reference surface 40. Other types of fastening are conceivable.

FIG. 2 shows a schematic view after a second step of the method according to the disclosure for producing an electronic assembly 5. After providing the printed circuit board 10 with at least one first electronic component 70 arranged on the reference surface 40, a sealing material 50 is then applied to the first side 12 of the printed circuit board 10.

The sealing material 50 is applied to the first side 12 of the printed circuit board 10 in such a way that the sealing material 50 surrounds a region or sub-region 20 of the first side 12 of the printed circuit board 10. The first components 70 on the first side 12 of the printed circuit board 10 are arranged in the sub-region 20 of the first side 12 of the printed circuit board 10 that is surrounded by the sealing material 50.

The sealing material 50 serves for forming a delimitation on the first side 12 of the printed circuit board 10, which forms a delimitation of the flowable covering material 60, so that during the later introduction of the covering material 60 specifically only the sub-region 20 of the first side 12 of the printed circuit board 10 is covered by the covering material 60 and the covering material 60 does not flow into regions that are not to be covered by the covering material 60.

The sealing material 50 may be applied to the first side 12 of the printed circuit board 10 or a part thereof at the periphery of the first side 12 of the printed circuit board 10. It is also conceivable that the sealing material 50 is applied at a distance from the periphery of the first side 12 of the printed circuit board 10. It is also possible that in certain regions the sealing material 50 is applied to the periphery of the first side 12 of the printed circuit board 10 and in other regions the sealing material 50 is applied at a distance from the periphery of the first side 12 of the printed circuit board 10.

The sealing material 50 is a so-called dam material. In other words, the sealing material 50 has a high viscosity. In particular, the sealing material 50 does not flow after being applied and does not spread out on the first side 12 of the printed circuit board 10. The area covered by the sealing material 50 does not change after application of the sealing material 50 to the first side 12 of the printed circuit board 10 (at least not before arranging and pressing in the second component 80).

The sealing material 50 may be for example an epoxy resin with fillers.

The sealing material 50 is applied at such a height (the height extends from the bottom upward in FIG. 2) or has a height that is greater than the height of the first component 70 and of the associated wire bond or the associated wire bonds or the associated electrical connecting line 85. It is also conceivable that the component 70 is fastened on the printed circuit board 10 by means of soldering. This ensures that there is a sufficiently high delimitation or a sufficiently high periphery on the first side 12 of the printed circuit board 10 around the first component 70 in order to apply the flowable coating material 60 in a later method step to the sub-region of the first side 12 of the printed circuit board 10 that is delimited or bounded by the sealing material 50 in such a way that the first component 70 (and its electrical connections and possibly further electrical components present on the first side 12 of the printed circuit board) is or are completely covered by the covering material 60. As a result, the first component 70 and its electrical connections (as well as further electrical components on the first side 12 of the printed circuit board 10, in particular all of the electrical components on the first side 12 of the printed circuit board 10) are reliably electrically insulated (from the surrounding oil).

FIG. 3 shows a schematic view after a third step of the method according to the disclosure for producing an electronic assembly 5. Then the second component 80 is arranged. The second component 80 may be a sensor and/or a connector. The second component 80 is arranged in such a way that the second component 80 is partially arranged on the reference surface 40.

The second component 80 has such a form and is arranged on the reference surface 40 in such a way that the second component 80 is pressed into the sealing material 50. The second component 80 is pressed so deeply into the sealing material 50 that the second component 80 is arranged with a part flat against the reference surface 40.

The intermediate space between the part of the second component 80 that is located above the first side 12 of the printed circuit board 10 (in FIG. 3) and the first side 12 of the printed circuit board 10 is thereby sealed by the sealing material 50 in an oil-tight or liquid-tight manner. When the second component 80 is pressed into the sealing material 50, the sealing material 50 has not yet cured, but is (viscously) liquid.

The described arrangement and formation of the second component 80 mean that no mechanical stresses occur in the second component 80 or in the printed circuit board 10.

The second component 80 has an electrical connecting line 85, for example a wire bond, by means of which the second component 80 is electrically connected to the first side 12 of the printed circuit board 10. The electrical connecting line 85 is located above the sub-region 20 of the first printed circuit board 10, which is surrounded or enclosed by the sealing material 50.

The second component 80 is arranged at such a distance in the horizontal direction (in FIG. 3, the horizontal direction extends from left to right) from the printed circuit board 10 that an end facing the printed circuit board 10 is pressed into the sealing material 50. The electrical connecting line 85 projects beyond the end of the second component 80.

FIG. 4 shows a schematic view of an embodiment of the electronic assembly 5 according to the disclosure. FIG. 4 consequently shows a schematic view after a fourth or fifth step of the method according to the disclosure for producing an electronic assembly 5.

A covering material was in the fourth step onto the sub-region 20 of the first side 12 of the printed circuit board 10 that is surrounded by the sealing material 50 (and partially to the sealing material 50).

Subsequently, the sealing material 50 and the covering material are cured. This may be performed in one step or in two steps. The curing may for example be achieved by heating the sealing material 50 and/or the covering material.

The covering material may be or comprise an epoxy resin.

The sealing material 50 and/or the covering material are electrically insulating or non-conducting.

The reference surface 40 extends substantially parallel to the first side 12 of the printed circuit board 10 and the second side 14 of the printed circuit board 10.

The second component 80 may be in surface-area contact, i.e. not just at discrete points, with the reference surface 40.

Figure 5:
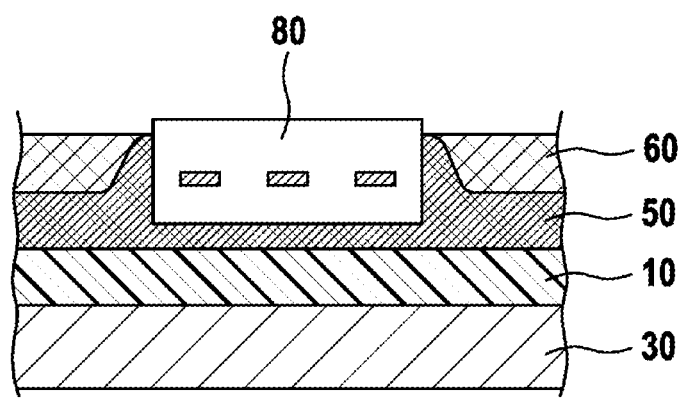
FIG. 5 shows a cross-sectional view of the electronic assembly from FIG. 5 along the line V-V.

FIG. 5 shows a cross-sectional view of the electronic assembly 5 from FIG. 5 along the line V-V. In FIG. 5 it can be seen that the second component 80 has been pressed into the sealing material 50. The upper edge of the sealing material 50 may finish flush with the upper edge of the second component 80.

It is also conceivable that the upper edge of the second component 80 protrudes (upward) beyond the edge of the sealing material 50.

The figures in each case only show a detail. In FIGS. 1-3, the printed circuit board extends further to the right. In FIG. 4, the printed circuit board 10 and the covering material 60 extend further to the right. Further to the right of the detail shown in FIG. 4, further electrical components may be arranged on the first side 12 of the printed circuit board 10.

In FIG. 5, the printed circuit board 10, the sealing material 50 and the covering material 60 extend further to the right and further to the left.

Finally, it should be pointed out that terms such as "having", "comprising" etc. do not exclude other elements or steps and terms such as "a" or "one" do not exclude more than one. Designations in the claims should not be regarded as restrictive.

The invention claimed is:

1. A method for producing an electronic assembly for a transmission control module including a printed circuit board having a first side, a second side facing away from the first side, and at least one first electronic component arranged on the first side, the method comprising:
    arranging the printed circuit board with the second side at least partially on a reference surface;
    applying a sealing material that is not flowable prior to being cured to the first side, the sealing material surrounding a sub-region of the first side of the printed circuit board;
    arranging a second component at least partially on the reference surface such that the second component is partially pressed into the sealing material;
    electrically connecting the second component to the printed circuit with an electrical connecting line;
    applying a covering material to the sub-region of the first side of the printed circuit board that is surrounded by the sealing material, to a portion of the electrical connecting line, and to the at least one first electronic component;
    curing the sealing material; and
    curing the covering material.

2. The method as claimed in claim 1, wherein the reference surface is a surface of a heat sink configured to dissipate heat from the electronic assembly.

3. The method as claimed in claim 1, further comprising:
removing the printed circuit board and the second component from a mounting aid,
wherein the reference surface is a surface of the mounting aid.

4. The method as claimed in claim 1, the applying of the sealing material further comprising:
applying the sealing material to a peripheral region of the first side of the printed circuit board.

5. The method as claimed in claim 1, the applying of the covering material further comprising:
applying the covering material to the first side of the printed circuit board such that the covering material covers and/or encloses the electrical connecting line.

6. The method as claimed in claim 1, wherein the sealing material has a first coefficient of thermal expansion that is the same as a second coefficient of thermal expansion of the covering material.

7. An electronic assembly for a transmission control module, comprising:
a printed circuit board including:
a first side;
a second side facing away from the first side; and
at least one first electronic component arranged on the first side, wherein the printed circuit board is arranged with the second side on a reference surface;
a sealing material that is not flowable prior to being cured arranged on the first side, the sealing material surrounding a sub-region of the first side of the printed circuit board;
at least one second component comprising an electrical connecting line electrically connected to the sub-region of the printed circuit board and partially arranged on the reference surface, such that the at least one second component is partially pressed into the sealing material in order to seal an intermediate space between the at least one second component and the first side of the printed circuit board; and
a covering material arranged on the sub-region of the first side that is surrounded by the sealing material and on the at least one first electronic component.

8. The electronic assembly as claimed in claim 7, wherein the reference surface is a surface of a heat sink configured to dissipate heat from the electronic assembly.

9. The electronic assembly as claimed in claim 7, wherein the sealing material is arranged on a peripheral region of the first side of the printed circuit board.

10. The electronic assembly as claimed in claim 7, wherein the covering material covers and/or encloses the electrical connecting line that electrically connects the second component to the printed circuit board.

11. The electronic assembly as claimed in claim 7, wherein the sealing material has a first coefficient of thermal expansion that is substantially the same as a second coefficient of thermal expansion of the covering material.

12. The method as claimed in claim 1, wherein the covering material is flowable prior to being cured.

13. The electronic assembly as claimed in claim 7, wherein the covering material is flowable prior to being cured.

14. The method as claimed in claim 1, wherein the sealing material does not flow between the application of the sealing material and the pressing of the second component into the sealing material, and the arranging of the second component occurs after the applying of the sealing material.

* * * * *